United States Patent
Matumoto

(10) Patent No.: US 7,872,561 B2
(45) Date of Patent: Jan. 18, 2011

(54) COMPOSITE TRANSFORMER AND INSULATED SWITCHING POWER SOURCE DEVICE

(75) Inventor: Tadahiko Matumoto, Otsu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 93 days.

(21) Appl. No.: 12/137,966

(22) Filed: Jun. 12, 2008

(65) Prior Publication Data
US 2008/0253149 A1 Oct. 16, 2008

Related U.S. Application Data

(63) Continuation of application No. PCT/JP2006/321711, filed on Oct. 31, 2006.

(30) Foreign Application Priority Data

Dec. 16, 2005 (JP) ............................. 2005-363129

(51) Int. Cl.
*H01F 5/00* (2006.01)
(52) U.S. Cl. ..................................... 336/200
(58) Field of Classification Search .................. 336/65, 336/83, 200, 232, 180–184, 170, 212
See application file for complete search history.

(56) References Cited

U.S. PATENT DOCUMENTS

| | | | | |
|---|---|---|---|---|
| 6,049,258 | A * | 4/2000 | Fawal et al. ................. | 333/177 |
| 6,281,779 | B1 * | 8/2001 | Matsumoto et al. ......... | 336/200 |
| 6,348,848 | B1 * | 2/2002 | Herbert ....................... | 336/178 |
| 6,696,909 | B2 * | 2/2004 | Inoue et al. .................. | 336/200 |
| 6,867,678 | B2 * | 3/2005 | Yang ............................ | 336/200 |
| 6,927,661 | B2 * | 8/2005 | He et al. ...................... | 336/200 |
| 7,304,862 | B2 * | 12/2007 | Busletta et al. .............. | 361/760 |
| 2005/0110606 | A1 * | 5/2005 | Vinciarelli ................... | 336/200 |

FOREIGN PATENT DOCUMENTS

| JP | 3-3722 | 1/1991 |
|---|---|---|
| JP | 3-84906 | 4/1991 |
| JP | 6-112064 | 4/1994 |
| JP | 6-338428 | 12/1994 |
| JP | 7-245222 | 9/1995 |

OTHER PUBLICATIONS

International Search Report.
Written Opinion.
Official Communication issued in corresponding Chinese Patent Application No. 200680046322.3, mailed on Sep. 9, 2010.

* cited by examiner

*Primary Examiner*—Tuyen Nguyen
(74) *Attorney, Agent, or Firm*—Keating & Bennettt, LLP

(57) ABSTRACT

An E-shaped transformer core has a middle leg and one pair of outer legs and on opposite sides with respect to the middle leg. A first pair of coils including at least two coils are wound around the middle leg so that a power transmission transformer unit is formed. The outer leg is divided into two outer leg portions and with a space therebetween allowing coil wiring therebetween, and a second pair of coils including two coils are respectively wound around the respective two outer leg portions and so as to have mutually opposite winding directions, so that a signal transmission transformer unit is formed.

9 Claims, 8 Drawing Sheets

FIG.1 (D) PRIOR ART

COMPOSITE TRANSFORMER AND INSULATED SWITCHING POWER SOURCE DEVICE

CROSS-REFERENCE TO RELATED APPLICATIONS

This is a continuation under 35 U.S.C. §111(a) of PCT/JP2006/321711 filed Oct. 31, 2006, and claims priority of JP2005-363129 filed Dec. 16, 2005, incorporated by reference.

BACKGROUND

1. Technical Field

The present disclosure relates to a composite transformer which is provided with a plurality of transformer units and has functions of power transmission and voltage conversion between primary and secondary and also a function of signal transmission between primary and secondary.

2. Background Art

Patent Document 1, Japanese Unexamined Patent Application Publication No. 2000-260639, discloses an arrangement in which a plurality of transformer units which can be regarded as being independent of each other are formed using a pair of cores.

FIGS. 1(A)-1(D) and FIG. 2 are diagrams illustrating an example of a configuration of a transformer according to Patent Document 1. FIGS. 1(A)-1(D) are diagrams illustrating patterns of individual layers of a multilayer substrate.

FIG. 2 is a cross-sectional side view of the transformer which is taken along lines X1-X1, X2-X2, X3-X3, and X4-X4 shown in FIG. 1. As illustrated in FIGS. 1(A)-1(D) and FIG. 2, this transformer has a multilayer substrate composed of eight layers, including a first printed coil substrate 11, a second printed coil substrate 12, a third printed coil substrate 13, a fourth printed coil substrate 14, and layers forming return wires of these coils.

In this eight-layer multilayer substrate, two outer holes 11a and 11c and one middle hole 11b, through which two outer legs 6a and 6c and one middle leg 6b of an E-E-shaped or E-I-shaped three-leg core pass, are arrayed in a straight line. A pair of cores of the three-leg core are fitted to each other with the multilayer substrate sandwiched between, so that closed magnetic paths are formed.

In the three-leg core, the two outer legs have the same cross-sectional area, and the distances between the middle leg and the individual outer legs are equal. Two magnetic paths formed by the middle leg and the individual outer legs have the same magnetic resistance. On each of the first printed coil substrate 11 and the third printed coil substrate 13, a coil is spirally wound around the middle hole 11b, so that a primary coil and a secondary coil of a first transformer unit is formed. In each of the second printed coil substrate 12 and the fourth printed coil substrate 14, a clockwise coil is wound around one of the outer holes and a counterclockwise coil is wound around the other one of the outer holes with the same number of turns. These coils are connected in series to form a primary coil and a secondary coil of a second transformer unit.

In the second transformer unit, a voltage induced in the coil wound around the one of the outer holes by the action of the first transformer unit is canceled so as to be zero volts by a voltage induced in the coil wound around the other one of the outer holes, which is applied in the opposite direction and is equal in absolute value to the voltage induced in the coil wound around the one of the outer holes. A magnetic flux generated in the one of the outer legs and a magnetic flux generated in the other one of the outer legs by the action of the second transformer unit cancel out each other in the middle leg. Thus, the action of the second transformer unit does not affect the first transformer unit. Utilizing this principle, the first transformer unit and the second transformer unit operate independently of each other while sharing one core.

Improvements to be Made

In Patent Document 1, the outer legs having coils wound therearound with the same number of turns in mutually opposite directions are arranged at opposite positions via the middle leg and have a distance therebetween. Such an arrangement can be further improved, as follows.

First, there exists the possibility of occurrence of a failure in which interference occurs between individual transformer units due to a manufacturing problem. The first and second transformer units in Patent Document 1 can independently operate when a pair of cores are properly fitted to each other. However, when a small gap exists at the joint of either one of the outer legs due to dust or the like, interference due to the two legs occurs, resulting in malfunction of an electronic device using the transformer units, depending on the degree of the interference. A greater amount of magnetic flux, which has passed along the middle leg, passes along a magnetic path that has smaller magnetic resistance than the other parallel magnetic path. The magnetic path formed by the outer leg having a small gap and the middle leg has a larger magnetic resistance than the other magnetic path formed by the other outer leg and the middle leg, and thus has a smaller amount of magnetic flux passing therealong than the other magnetic path. Therefore, the voltage induced in the coil wound around the outer leg with the small gap is smaller than that induced in the coil wound around the other outer leg. Accordingly, the voltage generated by the action of the first transformer unit is not completely canceled, and the voltage appears at the output of the second transformer unit. On the other hand, also regarding a magnetic flux generated by the action of the second transfer unit, a larger magnetic flux is present in the other outer leg than the outer leg with the small gap. Thus, the magnetic fluxes do not completely cancel out each other in the middle leg, and the voltage generated by the second transformer unit appears at the output of the first transformer unit.

Second, a large area is necessary for pattern wiring. In order to serially connect coils wound around outer holes with the same number of turns in mutually opposite directions, it is necessary to provide two wires for go and return paths between the individual coils. However, when the distance between the two outer legs is large, the length of the two wires is large, which leads to a large area being necessary for pattern wiring. When pattern wiring of the coils of the first transformer unit and the second transformer unit is provided on the same layer in a multilayer substrate, the area necessary for the pattern wiring of the coils wound around the outer holes increases. As a result, the pattern area for the coils of the first transformer unit has to be decreased by the increase of the area necessary for the pattern wiring for the coils. Consequently, the thickness of the coil of the first transformer unit decreases and the resistance of the coil increases. When the first transformer unit receives a high power, loss is increased due to an increase in the resistance of the coil.

Third, an increase in the distance between the outer legs increases the length of a magnetic path formed by the cores in the second transformer unit, and thus an AL value (inductance per one turn) decreases. When a pulse signal is to be transmitted by the second transformer unit, a reactive current according to an exciting inductance flows. Thus, loss increases when the exciting inductance decreases.

When the number of turns of the coil in the second transformer unit is increased in order to compensate for the decrease in the exciting inductance, the area necessary for pattern wiring increases. Further, when the number of turns of the coil in the second transformer unit is increased while the second transformer unit interferes with the first transformer unit, the interference voltage increases with increasing number of turns. This leads to malfunction of an electronic apparatus using such a transformer.

SUMMARY

Accordingly, the present disclosure presents a composite transformer having the above-described improvements, namely, less interference between a plurality of transformer units, less loss, and less decrease in an AL value.

Also disclosed is an insulated switching power supply device provided with the composite transformer.

In various embodiments, the transformer and the power supply device may have one or more of the following features.

(1) A composite transformer comprises a core having a middle leg and at least one pair of outer legs on opposite sides with respect to the middle leg and forming a closed magnetic path, a first pair of coils including at least two coils wound around the middle leg of the core, and a second pair of coils including at least two coils respectively wound around two respective outer leg portions obtained by dividing at least one of the one pair of outer legs with a space therebetween allowing coil wiring therebetween, so as to have mutually opposite winding directions.

(2) Each of the one pair of outer legs is divided into two outer leg portions with a space therebetween allowing coil wiring therebetween, and the second pair of coils are wound around each of the one pair of outer legs.

(3) A printed board is provided having penetration holes through which the middle leg and the outer legs or the outer leg portions of the core are respectively inserted, and the coils are configured as conductor patterns formed around the penetration holes of the printed board.

(4) The core is constituted by two members sandwiching the printed board, and a core fixing metal member is provided for fixing the two members while permitting joint surfaces thereof to rub against each other while the two members overlie each other with the printed board therebetween.

(5) An insulated switching power supply device uses the composite transformer, in which an input filter for receiving a direct current and at least one power switch for converting a direct current into an alternating current by a switching operation are provided in a primary-side circuit, and at least one synchronous rectifier and an output filter for converting an alternating current into a direct current are provided in a secondary-side circuit, in which the composite transformer is connected such that a transformer unit comprising the first pair of coils of the composite transformer transmits alternating power from the primary-side circuit to the secondary-side circuit and that a transformer unit comprising the second pair of coils of the composite transformer transmits a first pulse signal indicating a timing immediately before a turn-on of the power switch, from the primary-side circuit to the secondary-side circuit, and in which a synchronous rectifier turn-off control circuit for detecting the first pulse signal and turning off the synchronous rectifier is provided in the secondary-side circuit.

(6) An insulated switching power supply device uses the composite transformer, in which an input filter for receiving a direct current and at least one power switch for converting a direct current into an alternating current by a switching operation are provided in a primary-side circuit, and at least one synchronous rectifier and an output filter for converting an alternating current into a direct current are provided in a secondary-side circuit, in which an output detecting circuit for detecting an output voltage or an output current is provided in the secondary-side circuit, in which the composite transformer is connected such that a transformer unit comprising the first pair of coils of the composite transformer transmits alternating power from the primary-side circuit to the secondary-side circuit and that a transformer unit comprising the second pair of coils of the composite transformer transmits a second pulse signal indicating an off-timing of the power switch from the secondary-side circuit to the primary-side circuit, and in which a power switch turn-off control circuit for detecting the second pulse signal and turning off the power switch is provided in the primary-side circuit.

According to the described features, the following advantages can be obtained.

(1) The divided two outer leg portions having a certain amount of space therebetween allowing coil wiring are adjacent to each other. Thus, when dust is disposed at the joint of one of the two outer leg portions, a small gap is also present at the other one of the outer leg portions. Therefore, the magnetic resistances of the magnetic paths of the individual outer leg portions are not likely to be unbalanced, and thus interference is not likely to occur between transformers using the first and second pairs of coils.

In addition, since the divided two outer leg portions having a certain amount of space therebetween are adjacent to each other, the length of a wire for serially connecting both winding portions for winding one coil around the individual two outer leg portions is decreased. Thus the area necessary for pattern wiring is also decreased. In addition, by allocating the area corresponding to the decrease to, for example, a power transmission transformer unit pattern using the first pair of coil, low loss can be achieved.

Further, the length of a magnetic path constituting the transformer using the second pair of coils decreases, and thus an AL value increases. Accordingly, a required exciting inductance can be retained while the number of turns of the second pair of coils is restricted. Thus, conduction loss due to an exciting current can be suppressed, and thus low loss can be achieved.

In addition, the number of turns of the second pair of coils is proportional to the interference voltage due to the transformer using the first pair of coils. Thus, interference can be effectively suppressed by restricting the number of turns of the second pair of coils.

(2) When both of the pair of outer legs are divided into two outer leg portions with a space therebetween, and the second pair of coils are wound around the two outer leg portions of both of the individual two outer legs, three transformers independent of each other can be provided.

(3) When the coils are configured as conductor patterns formed around opening portions of a printed board through which the outer legs or the outer leg portions or the middle leg of the core are respectively inserted, a plurality of independent transformers can be implemented simply by mounting the core to the printed board.

(4) When the core is constituted by two members sandwiching the printed board, and a core fixing metal member is provided for fixing the two members while permitting joint surfaces thereof to rub against each other while the two members overlie each other with the printed board therebetween, a decrease in an exciting inductance due to a failure in the core fitting condition which occurs after the cores are fitted to each other can be improved. In addition, when interference between the transformers is detected, the core fitting condition can be improved by rubbing the cores against each other. Thus, the defect ratio can be reduced.

(5) According to the insulated switching power supply device, one or more signal transmission transformers can be obtained using the same core for a power transmission transformer. Thus, reduction of the size and cost can be achieved, as compared with a configuration in which a signal transmission transformer between primary and secondary is used separately from the power transmission transformer. In addition, the insulated switching power supply device is advantageous compared with a photocoupler, which is a typical primary-secondary signal transmission element, in that it has a wider operation temperature range and is not subject to deterioration of a relative current transfer ratio (CTR) with passage of time.

Moreover, when the signal transmission transformer transmits the first pulse signal indicating a timing immediately before a turn-on of the power switch, from the primary-side circuit to the secondary-side circuit, a turn-off delay of a synchronous rectifier can be prevented. Thus, a highly efficient rectifying operation can be realized.

(6) When the signal transmission transformer transmits the second pulse signal indicating an off-timing of the power switch from the secondary side to the primary side to turn off the power switch, a photocoupler, which has the problems described above, is not necessary, and high-speed response to transient changes can be realized.

Other features and advantages will become apparent from the following description of embodiments thereof which refers to the accompanying drawings.

BRIEF DESCRIPTION OF THE DRAWINGS

FIGS. 1(A)-1(D) are diagrams illustrating examples of coil patterns of a printed circuit board in a transformer disclosed in Patent Document 1.

REFERENCE NUMERALS

Figure 1A:
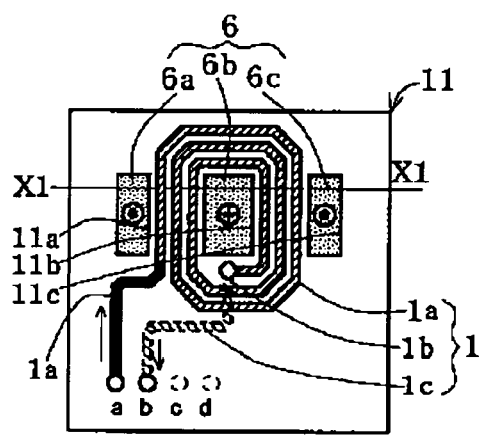
Figure 1B:
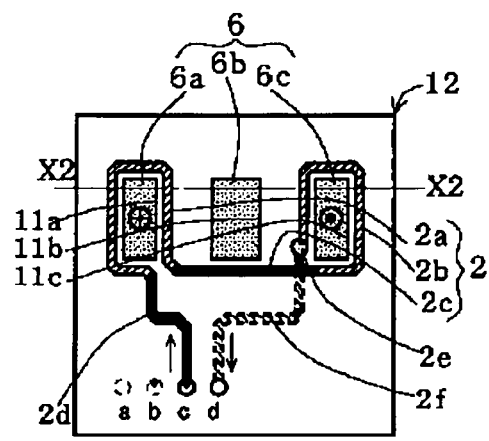
Figure 1C:
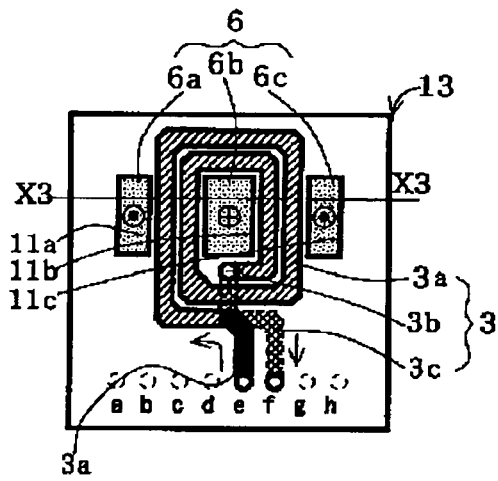
Figure 1C:
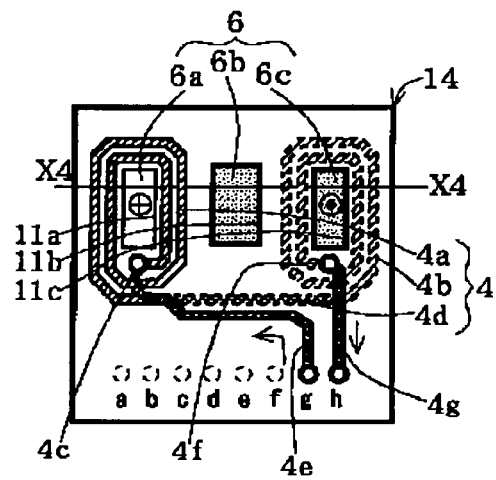
Figure 2:
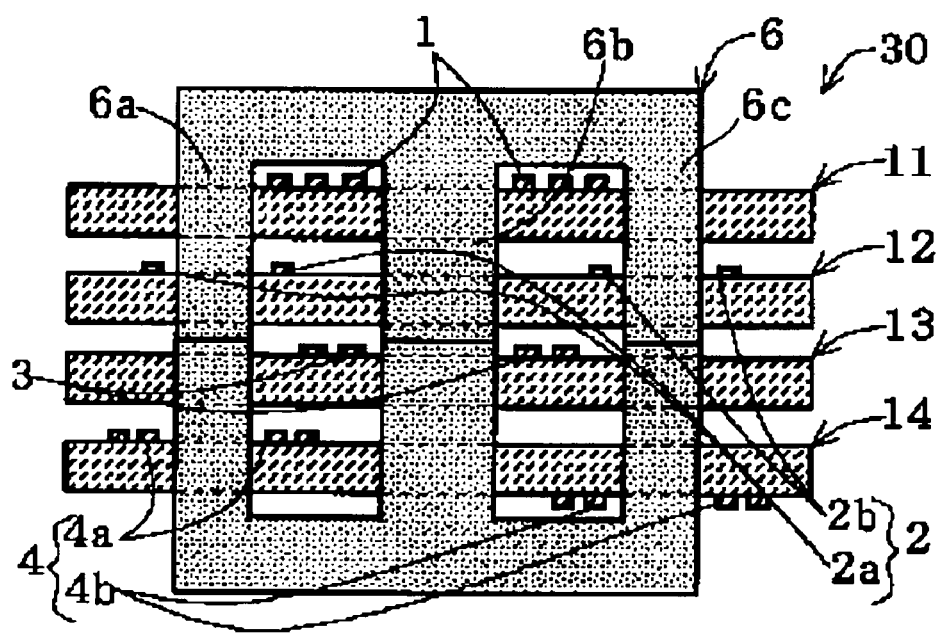
FIG. 2 is a cross-sectional side view of the transformer of FIG. 1.

15 + input of direct current input power supply
16 − input of direct current input power supply
17, 22 smoothing capacitors
18 power switch
19, 20 synchronous rectifiers
21 choke coil
23 + output of insulated switching power supply device
24 − output of insulated switching power supply device
25 multivibrator
29, 30 inverters
32 AND gate
36, 37 MOSFETs
40 NOR gate
41 comparator
47 reference voltage source
101a, 101c first printed coil wires
101b via hole
102a, 102c second printed coil wires
102b via hole
103a, 103c third printed coil wires
103b via hole
104a, 104c fourth printed coil wires
104b via hole
106 core (E-shaped core)
106a, 106c outer legs
106b middle leg
106aa, 106ab outer leg portions
106as space
107 core (I-shaped core)
108 core fixing metal
108f claws of core fixing metal member
108s core side supporting portion
108t spring portions of core fixing metal member
108m leg portions of core fixing metal member
110 printed board
111 first printed coil layer
112 second printed coil layer
113 third printed coil layer
114 fourth printed coil layer
122a, 122c fifth printed coil wires
122b via hole
123a, 123c sixth printed coil wires
123b via hole
130aa, 130ab penetration holes
130ca, 130cb penetration holes

DETAILED DESCRIPTION

First Embodiment

A transformer according to a first embodiment will be described on the basis of FIGS. 3(A)-4(B).

(E) and (F) in FIG. 3 are cross-sectional views of main parts of a transformer. As illustrated in these FIGS. 3(E) and 3(F), the transformer is composed primarily of a printed board 110, an E-shaped core 106, and an I-shaped core 107.

Figure 3A:
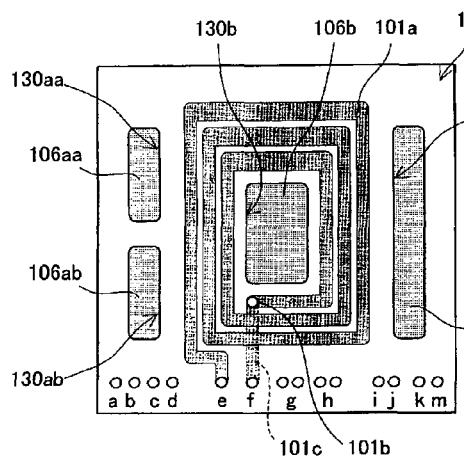
FIGS. 3(A)-3(F) are plan views of individual printed coil layers of a printed circuit board in a transformer according to a first embodiment.
Figure 3B:
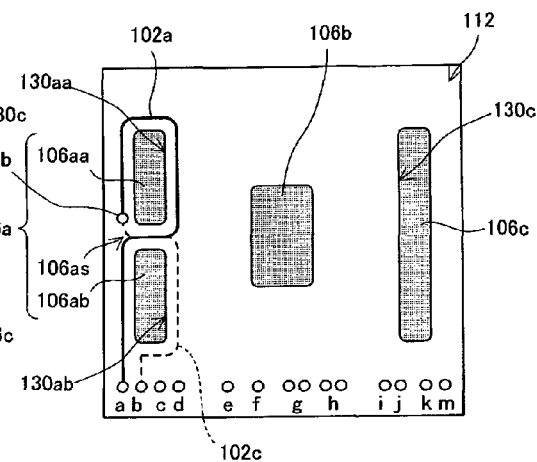
Figure 3C:
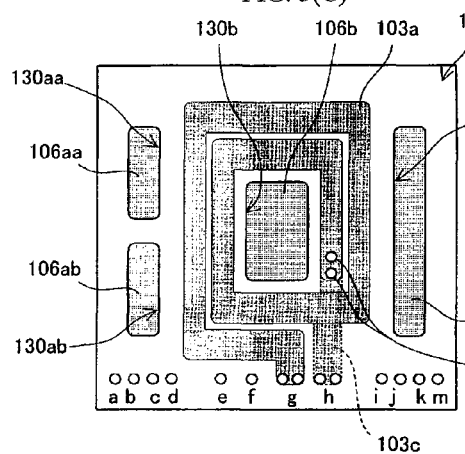
Figure 3D:
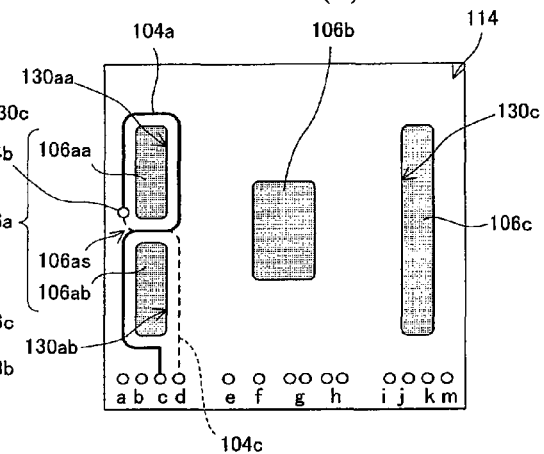

FIG. 3(A) is a plan view of a first printed coil layer of the printed board 110 which is a multilayer substrate, (B) is a plan view of a second printed coil layer of the printed board 110, (C) is a plan view of a third printed coil layer of the printed board 110, and (D) is a plan view of a fourth printed coil layer of the printed board 110. These plan views includes the cross-sections of leg portions of the E-shaped core 106.

As illustrated in FIG. 3, the E-shaped core 106 has a middle leg 106b and a pair of outer legs 106a and 106c on opposite sides with respect to the middle leg 106b. In addition, the outer leg 106a is divided in the direction orthogonal to the direction of the connection of the pair of outer legs (106a and 106c), into two outer leg portions 106aa and 106ab with a space 106 as therebetween. In this case, for example, the cross-sectional areas of the outer leg portions 106aa and 106ab are set to be equal so that the amounts of magnetic flux traveling through the outer leg portions 106aa and 106ab are equal to each other. Consequently, a four-leg core is formed.

The I-shaped core 107 has a rectangular plate shape and forms a several closed magnetic paths by being combined with the E-shaped core 106.

First printed coil wires 101a and 101c are formed around a penetration hole 130b through which the middle leg 106b of the E-shaped core 106 passes, in two layers on (opposite surfaces of) the first printed coil layer 111. These two-layered first printed coil wires 101a and 101c are made to conduct through a via hole 101b.

In addition, third printed coil wires 103a and 103c are formed around the penetration hole 130b through which the middle leg 106b of the E-shaped core 106 passes, in two layers on (opposite surfaces of) the third printed coil layer 113. These two-layered third printed coil wires 103a and 103c are made to conduct through a via hole 103b.

Second printed coil wires 102a and 102c are formed around penetration holes 130aa and 130ab through which the outer leg portions 106aa and 106ab of the E-shaped core 106 pass, in two layers on (opposite surfaces of) the second printed coil layer 112. These two-layered printed coil wires 102a and 102c are made to conduct through a via hole 102b.

Similarly, fourth printed coil wires 104a and 104c are formed around the penetration holes 130aa and 130ab through which the outer leg portions 106aa and 106ab of the E-shaped core 106 pass, in two layers on (opposite surfaces of) the fourth printed coil layer 114. These two-layered printed coil wires 104a and 104c are made to conduct through a via hole 104b.

The first printed coil wires 101a and 101c act as a primary coil, and the third printed coil wires 103a and 103c act as a secondary coil. The first printed coil wires 101a and 101c and the third printed coil wires 103a and 103c constitute a first pair of coils.

In addition, the second printed coil wires 102a and 102c act as a primary coil, and the fourth printed coil wires 104a and 104c act as a secondary coil. The second printed coil wires 102a and 102c and the fourth printed coil wires 104a and 104c constitute a second pair of coils.

Each of the first to fourth printed coil layers 111 to 114 are provided with a penetration hole 130c through which the outer leg portion 106c of the E-shaped core 106 passes.

Figure 3E:
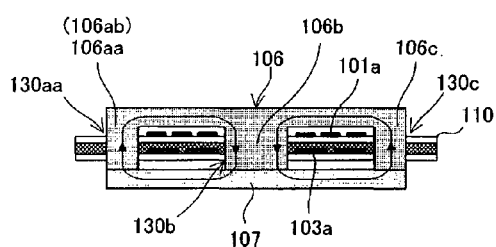

Loop arrows in FIG. 3(E) represent magnetic paths of a transformer constituted by the E-shaped core 106, the I-shaped core 107, and the first pair of coils. In the example shown in FIG. 3, the first printed coil wires 101a and 101c form a three-turn (3T) coil and the third printed coil wires 103a and 103c form a two-turn (2T) coil. Thus, these printed coil wires are used as a power transmission transformer unit with a turn ratio of 3:2.

Figure 3F:
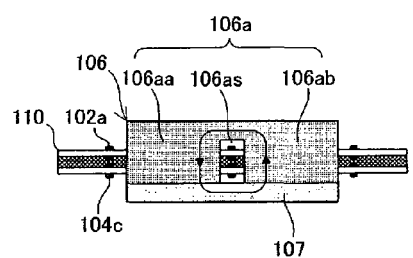

In addition, a loop arrow in FIG. 3(F) represents a magnetic path of a transformer constituted by the E-shaped core 106, the I-shaped core 107, and the second pair of coils. In the example shown in FIG. 3, the second printed coil wires 102a and 102c form a one-turn (1T) coil and the fourth printed coil wires 104a and 104c form a one-turn (1T) coil. Thus, these printed coil wires are used as a signal transmission transformer with a turn ratio of 1:1.

As illustrated in FIGS. 3(A) to 3(D), the printed board 110 has through holes a to m, forming input/output terminals of the individual transformers. Specifically, one end of the first printed coil wire 101a is connected to the through hole e, one end of the first printed coil wire 101c is connected to the through hole f, one end of the third printed coil wire 103a is connected to the through holes g, and one end of the third printed coil wire 103c is connected to the through holes h. Thus, the through holes e and f are used as terminals in the primary side of the power transmission transformer unit, and the through holes g and h are used as terminals in the secondary side of the power transmission transformer unit.

Similarly, one end of the second printed coil wire 102a is connected to the through hole a, one end of the second printed coil wire 102c is connected to the through hole b, one end of the fourth printed coil wire 104a is connected to the through c, and one end of the fourth printed coil wire 104c is connected to the through hole d. Thus, the through holes a and b are used as terminals in the primary side of the signal transmission transformer unit, and the through holes c and d are used as terminals in the secondary side of the signal transmission transformer unit.

Regarding the signal transmission transformer unit, when the coil in the primary side is viewed from the terminal using the through hole a toward the terminal using the through hole b, the coil is wound counterclockwise around the outer leg portion 106aa and is wound clockwise around the outer leg portion 106ab. When the coil in the secondary side is viewed from the terminal using the through hole c toward the terminal using the through hole d, the coil is wound counterclockwise around the outer leg portion 106aa and is wound clockwise around the outer leg portion 106ab. Consequently, both the primary and secondary coils are wound counterclockwise around the outer leg portion 106aa, and both the primary and secondary coils are wound clockwise around the outer leg portion 106ab.

When the power transmission transformer unit is operated, magnetic fluxes traveling from the middle leg 106b to the individual outer legs 106a and 106c are generated, as illustrated in FIG. 3(E). Thus, even when a magnetic flux passes through the outer leg 106, the magnetic resistance of a magnetic path formed by the middle leg 106b and the outer leg portion 106aa is equal to that of a magnetic path formed by the middle leg 106b and the outer leg portion 106ab, and thus the amounts of magnetic flux passing through these magnetic paths are the same. Therefore, the voltage induced by the coil wound around the penetration hole 130aa through which the outer leg portion 106aa passes due to the magnetic flux generated by the power transmission transformer unit is equal in absolute value to the voltage induced by the coil wound around the penetration hole 130ab through which the outer leg portion 106ab passes. In addition, these voltages have opposite polarities and thus offset each other. Thus, the voltage across the terminals on the primary side of the signal transmission transformer unit and the voltage across the terminals on the secondary side of the signal transmission transformer unit are both zero volts.

On the other hand, when the signal transmission transformer unit is operated, magnetic fluxes traveling through the two outer leg portions 106aa and 106ab are generated, as illustrated in FIG. 3(F). Since these two outer leg portions 106aa and 106ab are adjacent to each other and far from the middle leg 106b, the magnetic flux traveling through the outer leg portions 106aa and 106ab hardly passes through the middle leg 106b. Even if the magnetic flux passes through the middle leg 106b, such a magnetic flux is canceled since the amount of the magnetic flux generated in the outer leg portion 106aa is equal to that of the magnetic flux generated in the outer leg portion 106ab and the magnetic fluxes travel in opposite directions.

Because of this principle, the power transmission transformer unit and the signal transmission transformer unit do not affect each other and apparently act as independent transformers.

Figure 4A:
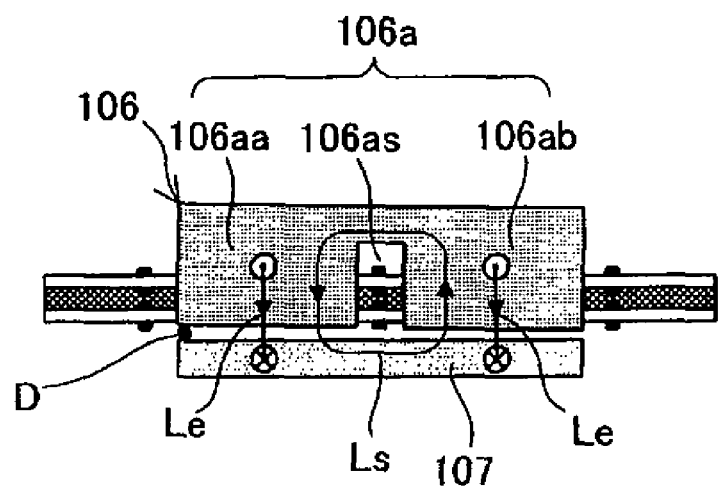
FIGS. 4(A)-4(B) are diagrams illustrating an effect of dust disposed between cores in a transformer according to the first embodiment and in a conventional transformer having a second transformer unit arranged in two legs of a three-leg core.
Figure 4B:
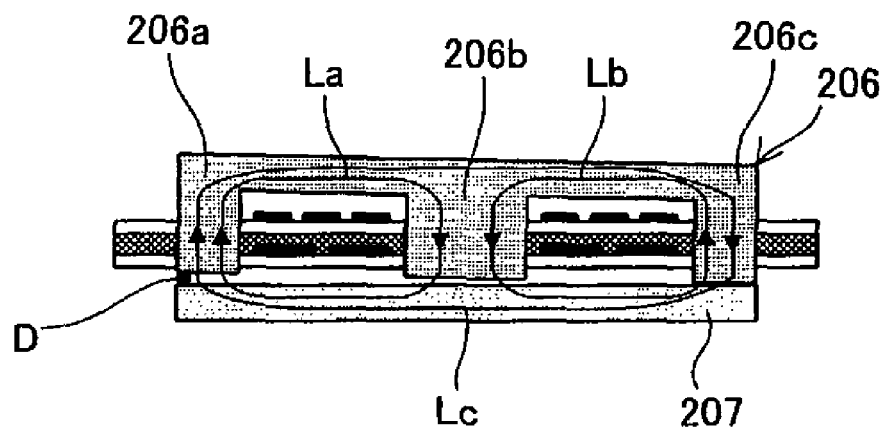

FIG. 4 shows diagrams illustrating an effect of dust disposed between cores, in the transformer according to the first embodiment and a conventional transformer in which a second transformer unit is arranged in two outer legs of a three-leg core. FIG. 4(A) illustrates a magnetic path in the signal transmission transformer unit according to the first embodiment. FIG. 4(B) illustrates magnetic paths in a signal transmission transformer unit and a power transmission transformer unit of a conventional transformer using a three-leg core.

In FIG. 4(B), when dust D is disposed between an outer leg 206a of an E-shaped core 206 and an I-shaped core 207, a gap is present between this outer leg 206a and the I-shaped core 207. However, little gap is present between the other outer leg 206c and the I-shaped core 207. Thus, there is a difference between magnetic paths La and Lb of the power transmission transformer unit in the intensity of magnetic flux traveling therethrough. As a result, coupling occurs between the magnetic flux traveling along the magnetic paths La and Lb of the power transmission transformer unit and the magnetic flux traveling along a magnetic path Lc of the signal transmission transformer unit. That is, interference occurs between the power transmission transformer unit and the signal transmission transformer unit.

On the other hand, in FIG. 4(A), when dust D is disposed between the outer leg portion 106aa of the E-shaped core 106 and the I-shaped core 107, a gap is present between this outer leg portion 106aa and the I-shaped core 107. However, since this outer leg portion 106aa and the other outer leg portion 106ab are adjacent to each other, the substantially the same amount of gap is present between the other outer leg portion 106ab and the I-shaped core 107. Thus, the magnetic flux densities of magnetic paths Le of the power transmission transformer unit which pass through both the outer leg portions 106aa and 106ab remain balanced. Therefore, no coupling occurs between the magnetic flux traveling along the magnetic paths Le of the power transmission transformer unit and the magnetic flux traveling along a magnetic path Ls of the signal transmission transformer unit.

Thus, according to the transformer of the present invention, interference is not likely to occur between the power transmission transformer unit and the signal transmission transformer unit.

In addition, as illustrated in FIG. 3, the two outer leg portions 106aa and 106ab are arranged so as to be adjacent to each other by providing the space 106 as in the outer leg 106a. With this arrangement, the winding range of a transformer unit decreases, and thus the transformer unit can act as a transformer suitable for signal transmission that does not require large power.

In addition, the coil of the signal transmission transformer unit is formed around one of the outer legs of the single E-shaped core 106. With this arrangement, a larger coil forming space (winding range) can be provided around the penetration hole 130b though which the middle leg 106b of the E-shaped core 106 penetrates, as compared with the signal transmission transformer unit. In addition, this arrangement can suppress conduction loss of the coil in the power transmission transformer and reduce loss in power transmission and voltage conversion.

Second Embodiment

In the following, a transformer according to a second embodiment will be described with reference to FIG. 5.

Figure 5A:
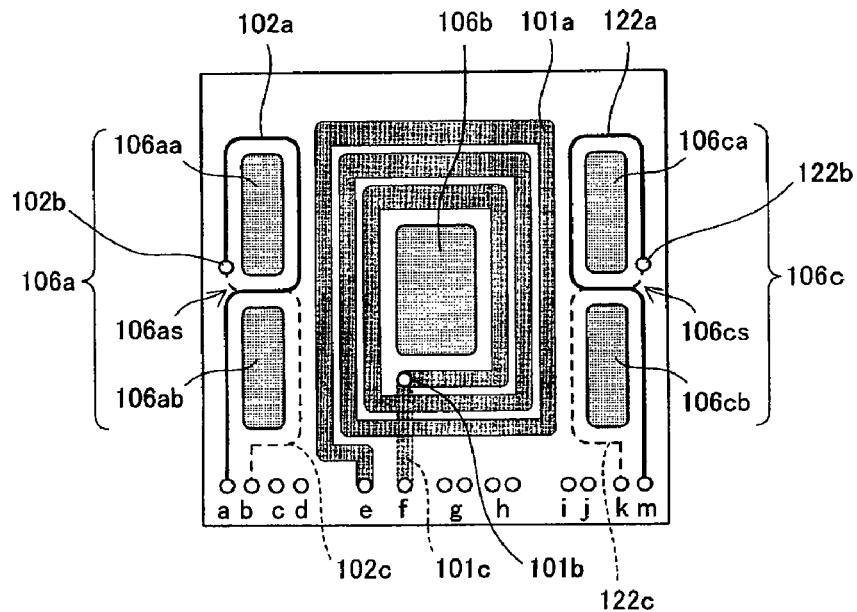
FIGS. 5(A)-5(B) are plan views of individual printed coil layers of a printed circuit board in a transformer according to a second embodiment.
Figure 5B:
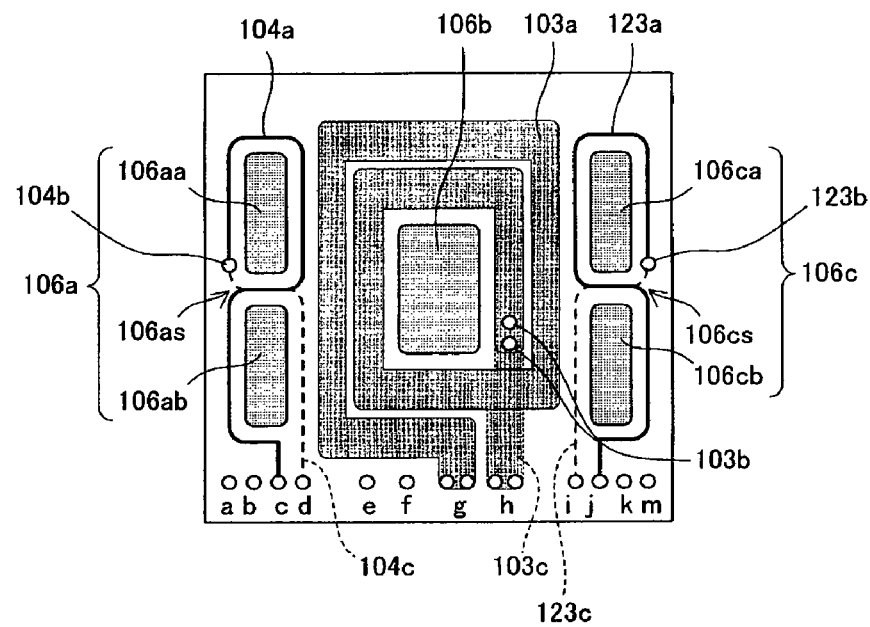

FIG. 5 shows diagrams illustrating examples of wiring formed on a printed board used in the transformer according to the second embodiment. Note that for convenience of the description, the examples are shown in two layers, without illustration of four layers as in the case of FIG. 3. In the first embodiment, a four-leg core is used. However, in this second embodiment, a five-leg core is used, and one power transmission transformer unit and two signal transmission transformer units are provided.

The cross-sectional structure of the entire transformer is substantially the same as that described in the first embodiment, and thus the illustration thereof will be omitted and only parts different from the first embodiments will be hereinafter described.

An E-shaped core 106 has a middle leg 106b and one pair of outer legs 106a and 106c on opposite sides with respect to the middle leg 106b. The outer leg 106a is divided in the direction orthogonal to the direction of the connection of the pair of outer legs (106a and 106c), into two outer leg portions 106aa and 106ab with a space 106 as therebetween. In this case, for example, the cross-sectional areas of the outer leg portions 106aa and 106ab are set to be equal so that the amounts of magnetic flux passing through the outer leg portions 106aa and 106ab are equal to each other. Similarly, the outer leg 106c is also divided in the direction orthogonal to the direction of the connection of the pair of outer legs (106a and 106c), into two outer leg portions 106ca and 106cb with a space 106cs therebetween. In this case, for example, the cross-sectional areas of the outer leg portions 106ca and 106cb are set to be equal so that the amounts of magnetic flux passing through the outer leg portions 106ca and 106cb are equal to each other. Second printed coil wires 102a and 102c and fourth printed coil wire 104a and 104c are wound around the outer leg portions 106aa and 106ab. Fifth printed coil wires 122a and 122c and sixth printed coil wires 123a and 123c are wound around the outer leg portions 106ca and 106cb, respectively.

The fifth printed coil wires 122a and 122c are formed in two layers and made to conduct through a via hole 122b. Similarly, the sixth printed coil wires 123a and 123c are formed in two layers and made to conduct through a via hole 123b.

Third Embodiment

In the following, a transformer according to a third embodiment will be described with reference to FIG. 6.

(E) and (F) in FIG. 3 illustrate a configuration in which the printed board 110 are sandwiched by the E-shaped care 106 and the I-shaped core 107. However, in this third embodiment, a detailed configuration for keeping the E-shaped core 106 and the I-shaped core 107 in an attached state.

Figure 6A:
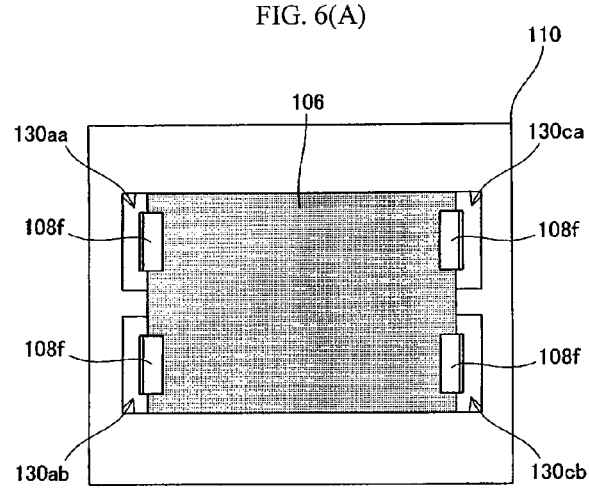
FIGS. 6(A)-6(C) are diagrams illustrating configurations of a transformer and a core fixing metal member according to a third embodiment.
Figure 6B:
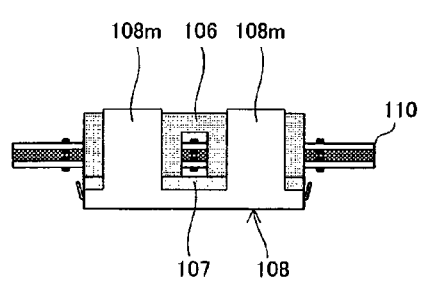
Figure 6C:
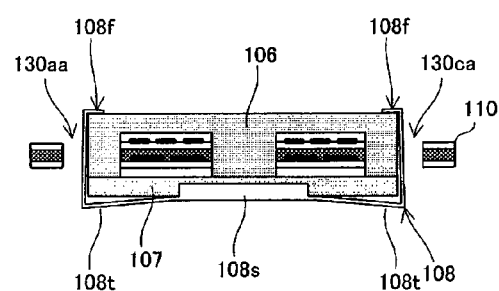

(A) in FIG. 6 is a plan view of a transformer formed together with a printed board 110, (B) is a right-side plan view of the transformer, and (C) is a front elevation view of the transformer.

The E-shaped core 106 and the I-shaped core 107 are fitted to each other by a core fixing metal member 108. The core fixing metal member 108 includes four claw portions 108f for engaging with the E-shaped core 106 at four points of the edges of the E-shaped core 106, a core side supporting portion 108s for supporting a center part of two longer edges of the I-shaped core, spring portions 108t, and four leg portions 108m.

The printed board 110 is provided with penetration holes 130aa, 130ab, 130ca, and 130cb through which respective outer leg portions (portions corresponding to the outer legs 106aa, 106ab, 106ca, and 106cb) pass.

When the E-shaped core 106 and the I-shaped core 107 are mounted to the printed board 110, the E-shaped core 106 and the I-shaped core 107 sandwich the printed board 110, and the core fixing metal member 108 is overlaid from the I-shaped core 107 side. Then, the claw portions 108f and the leg portions 108m of the core fixing metal member 108 are guided into the penetration holes 130aa, 130ab, 130ca, and 130cb, and the claw portions 108f are secured at four points of the shorter edges of the E-shaped core.

In this way, the four leg portions 108m and the side supporting portion 108s of the core fixing metal member 108 function as fixing parts for fixing the I-shaped core 107. The width of the leg portions 108m is smaller than the width (in the right-left direction in FIG. 6) of the penetration holes 130aa, 130ab, 130ca, and 130cb. Thus, the leg portions 108m can be slid in the width direction (the right-left direction in FIG. 6) by a distance corresponding to the difference between the widths of the leg portions and the penetration holes.

Therefore, when the I-shaped core 107 is slid while being fixed by the core side supporting portion 108s of the fixing metal member 108, until the right and left surfaces of the leg portions 108m come into contact with the right and left sides of the penetration holes 130aa, 130ab, 130ca, and 130cb, the joint surfaces of the E-shaped core 106 and the I-shaped core 107 rub against each other.

In the core fitting process in fabrication of the transformer, the joint surfaces of the E-shaped core 106 and the I-shaped core 107 may not tightly fitted to each other, resulting in reduction of exciting inductance and interference between transformer units. Even in this case, by applying the fabrication process in which the joint surfaces of the cores are rubbed against each other and then the I-shaped core 107 and the fixing metal member 108 are returned to the center position of the E-shaped core 106, most failures can be treated.

Fourth Embodiment

In the following, an insulated switching power supply device according to a fourth embodiment will be described with reference to FIG. 7 and FIG. 8.

Figure 7:
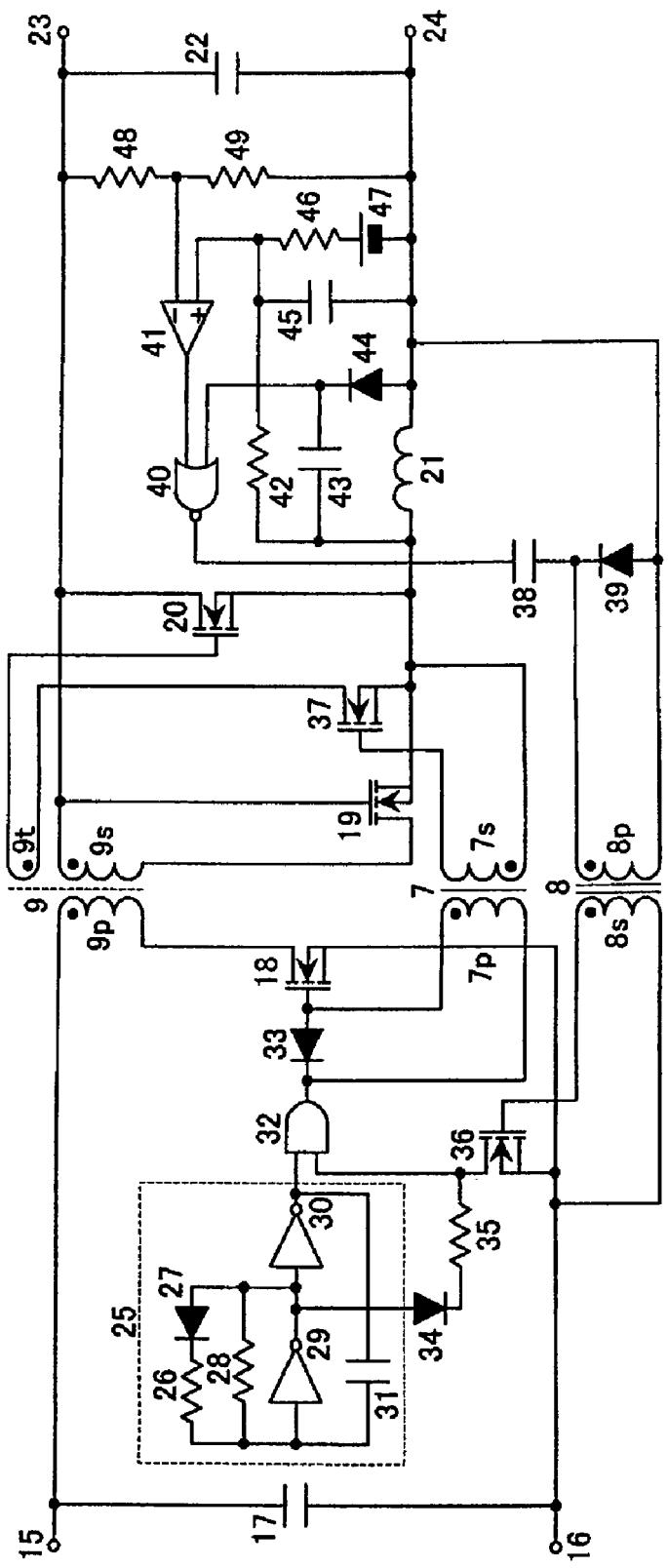
FIG. 7 is a circuit diagram of an insulated switching power supply device according to a fourth embodiment.
Figure 8:
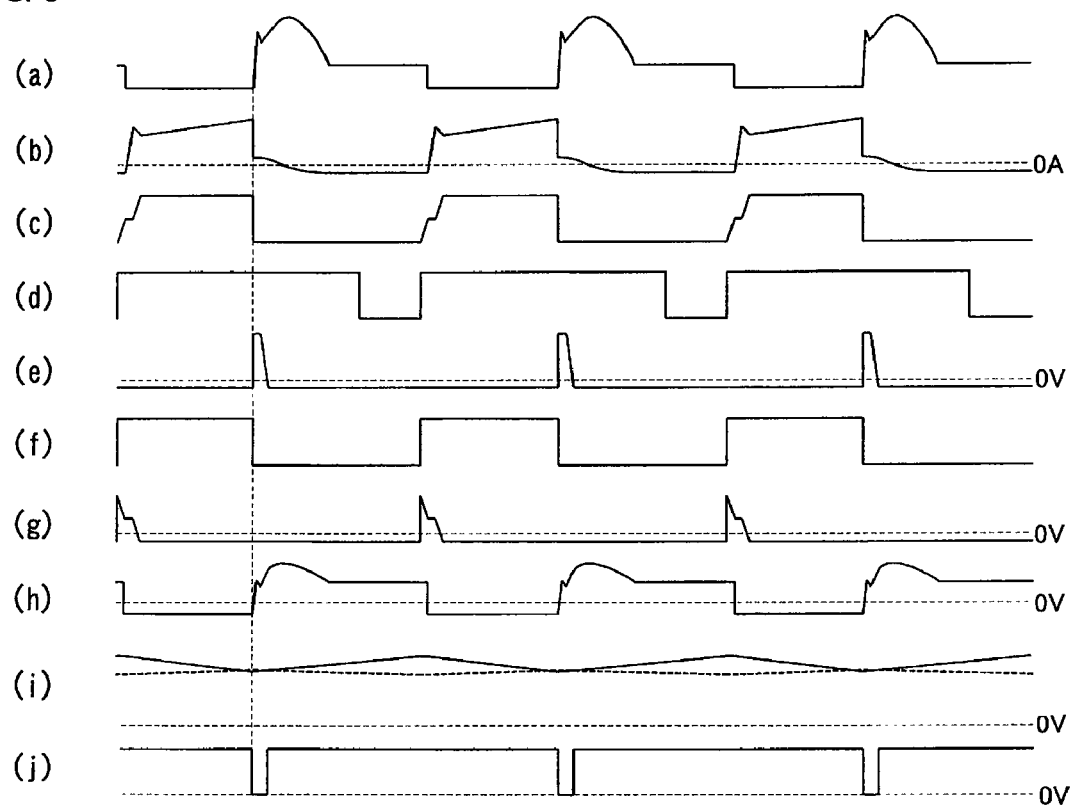
FIG. 8 shows waveform diagrams of main parts of the insulated switching power supply device.

FIG. 7 is a circuit diagram of an insulated switching power supply device, and FIG. 8 shows waveform diagrams of individual components of the insulated switching power supply device.

In this insulated switching power supply device, a transformer having the structure described in the second embodiment is used. This transformer constitutes a first signal transmission transformer unit 7, a second signal transmission transformer unit 8, and a power transmission transformer unit 9 illustrated in FIG. 7. The first signal transmission transformer unit 7 includes a primary coil 7p and a secondary coil 7s. The second signal transmission transformer unit 8 includes a primary coil 8p and a secondary coil 8s. The power transmission transformer unit 9 includes a primary coil 9p, a secondary coil 9s, and an auxiliary winding 9t.

A power conversion circuit is constituted by a + input 15 of a direct current input power supply, a − input 16 of the direct current input power supply, smoothing capacitors 17 and 22, a power switch 18, synchronous rectifiers 19 and 20, a choke coil 21, a + output 23 of an insulated switching power supply, and a − output of the insulated switching power supply.

In addition, a control circuit is constituted by a multivibrator 25, resistors 26, 28, 35, 42, 46, 48, and 49, diodes 27, 33, 34, 39, and 44, inverters 29 and 30, capacitors 31, 38, 43, and 45, an AND gate 32, a MOSFETs 36 and 37, a NOR gate 40, a comparator 41, and a reference voltage source 47.

This insulated switching power supply device is a monolithic resonant reset forward converter. A direct current input voltage applied across the + input 15 and the − input 16 is smoothed by the smoothing capacitor 17 and then switched by the power switch 18 connected via the primary coil 9p of the power transmission transformer unit 9 so as to be converted into an alternating current.

In FIG. 7, the arrangement for controlling the synchronous rectifier 20 for commutation (the auxiliary winding 9t, MOSFET 37, pulse transformer 7, and diode 33) is known, as disclosed in Japanese Unexamined Patent Application Publication No. 2000-262051. This arrangement uses one pulse transformer for transmission of a signal controlling the FET 37 for turning off the synchronous rectifier 20 for commutation. In FIG. 7, the first signal transmission transformer unit 7 is used as a pulse transformer.

The power transmission transformer unit 9 is provided with the auxiliary coil 9t in addition to the primary coil 9p and the secondary coil 9s. This auxiliary coil 9t corresponds to third printed coil wires, for example, which may be provided in addition to the first printed coil wires 101a and 101c and the second printed coil wires 102a and 102c shown in FIG. 5 in the similar manner.

In the meanwhile, ON/OFF control of the switching element of the primary side (the power switch 18 in FIG. 7) is performed by a control circuit provided in the primary side. Methods which can be applied in this case for detecting and controlling an output voltage include an indirect control method which utilizes a voltage of an auxiliary winding in a transformer and a direct control method in which an output voltage detecting circuit is provided in the secondary side so that an output voltage is fed back to the primary side via a photocoupler. The indirect control method has a problem in that the precision of output voltage detection is not satisfactory. The direct control method has a problem in that the operating temperature condition is limited since a photocoupler is used. Further, both the methods have a problem of poor responsiveness to changes in the output voltage.

On the other hand, there is a ripple detection-type switching power supply device (ripple converter) as a switching power supply device with satisfactory responsiveness.

A ripple converter has to have a control circuit in the secondary side with a view to detecting a ripple in an output voltage. However, such a ripple converter has a problem in that it requires an additional power supply for operating the control circuit when it is activated while no voltage is generated in the secondary side.

As a solution to the above problem, the inventor of the present invention has disclosed a control method in Japanese Patent Application NO. 2005-233507. In this control method, minimum required OFF control to be performed when a switching element in the primary side is ON and activated is performed in the primary side, and during normal operation, an off-timing signal for the switching element based on ripple variation is transmitted from the secondary side to the primary side via a pulse transformer to turn off the switching element (this ON/OFF relationship may be reversed). Because of this ripple converter, satisfactory responsiveness can be achieved, and further, it is not necessary to provide a power supply for activation of the control circuit in the secondary side since the control circuit for the switching element is basically provided in the primary side (the switching element operates without a signal from the secondary side in activation).

In the example illustrated in FIG. 7, an off-timing signal for the power switch 18 based on a ripple change is transmitted from the secondary side to the primary side via the second signal transmission transformer unit 8.

In FIG. 8, (a) is the drain voltage of the power switch 18, (b) is the drain current of the power switch 18, (c) is the gate voltage of the power switch 18, (d) is the output voltage of the multivibrator 25, (e) is the voltage of the primary coil 8p of the second signal transmission transformer unit 8, (f) is the output voltage of the AND gate 32, (g) is the voltage of the secondary coil 7s of the first signal transmission transformer unit 7, (h) is the gate voltage of the synchronous rectifier 20, (i) is one input voltage of the comparator 41, and (j) is the other input voltage of the comparator 41.

In the following, circuit operations will be described also with reference to this FIG. 8.

During an ON period of the power switch 18, the power transmission transformer unit 9 transmits the alternating current from its primary coil 9p to the secondary coil 9s. The alternating current is rectified by the rectification-side synchronous rectifier 19 and the commutation-side synchronous rectifier 20. Then, the rectified current is smoothed by an output filter constituted by the choke coil 21 and the smoothing capacitor 22 so as to be converted into a direct current again, and the direct current voltage is output from the + output 23 and the − output 24.

After the power switch 18 is turned off, an exciting inductance of the power transmission transformer unit 9 and an equivalent parasitic capacitance of the power switch 18 are LC-resonated, so that the transformer is reset (see, FIGS. 8(a) and 8(b)).

In an OFF period of the power switch 18 after the transformer is reset, a transformer exciting current flows in a loop, including the secondary coil 9s of the power transmission transformer unit 9, the synchronous rectifier 20, and a parasitic diode of the synchronous rectifier 19, in that order. Thus, the voltage across the power transmission transformer unit 9 is clamped to zero volts, and the drain voltage of the power switch 18 is clamped to the input voltage.

Power conversion is performed under the above cycle.

The multivibrator 25 in the control circuit vibrates at a predetermined frequency (see, FIG. 8(d)). At the ON-timing of the multivibrator 25, the drain voltage of the MOSFET 36 is also at a high level. Thus, the output of the AND gate 32 is also brought to a high level in response to the turn-on of the multivibrator 25 (see, FIG. 8(f)).

When the AND gate 32 is turned on, the gate of the power switch 18 is charged through the primary coil 7p of the first signal transmission transformer unit 7 (see, FIG. 8(c)). A pulse signal generated at this time is transmitted from the primary coil 7p to the secondary coil 7s of the first signal transmission transformer unit 7, and the MOSFET 37 is turned on (see, FIG. 8(g)). When the MOSFET 37 is turned on, charge stored at the gate of the commutation-side synchronous rectifier 20 is discharged and the synchronous rectifier 20 is turned off (see, FIG. 8(h)).

Since the primary coil 7p of the first signal transmission transformer unit 7 is present in the gate charge path of the power switch 18, the power switch 18 is turned on with a predetermined delay time. This operation causes the commutation-side synchronous rectifier 20 to be turned off immediately before the turn-on of the power switch 18. Therefore, no short-circuit current due to a turn-off delay of the commutation-side synchronous rectifier 20 is generated, and thus highly efficient power conversion operation can be realized.

The control circuit does not perform traditional feedback control using an error amplifier but performs control using a comparator, in order to achieve high-speed response to transient changes in the input voltage and output current.

A voltage divided by the resistors 48 and 49 is input to the inverting input of the comparator 41, and a voltage of the reference voltage source 47 is input to the non-inverting input of the comparator 41 via the resistor 46. The comparator 41 compares the voltages.

A ripple voltage is superimposed on the output voltage, and a lamp voltage opposite to the ripple voltage is superimposed on the voltage to be input to the non-inverting input of the comparator 41 (see, FIG. 8(i)).

When the input voltage of the inverting input of the comparator 41 exceeds the input voltage of the non-inverting input of the comparator 41 during an ON period of the power switch 18, the output voltage of the comparator 41 becomes a low level and is input to the NOR gate 40 (see, FIG. 8(j)).

The other input of the NOR gate 40 becomes a low level during the ON period of the power switch 18, and the output of the NOR gate 40 is brought from a low level to a high level. Thus, a current flows into the primary coil 8p of the second signal transmission transformer unit 8 via the capacitor 38 and a pulse signal is generated. This pulse signal is transmitted from the primary coil 8p to the secondary coil 8s of the second signal transmission transformer unit 8, and the MOSFET 36 is turned on (see, FIG. 8(e)).

During an ON period of the inverter 29 (OFF period of the multivibrator 25), charge is stored at the drain of the MOSFET 36 through the diode 34 and the resistor 35. When the MOSFET 36 is turned on, the drain of the MOSFET 36 is brought from a high level to the low level. When the drain of the MOSFET 36 becomes the low level, the output of the AND gate 32 also becomes a low level. Thus, the charge stored at the gate of the power switch 18 is discharged through the diode 33, and the power switch 18 is turned off.

In this way, by controlling the timing of a pulse signal for causing the power switch 18 to be turned off, an ON period of the power switch 18 is controlled. The length of an OFF period of the power switch 18 is obtained by subtracting an ON period of the power switch 18 from a vibration cycle of the multivibrator 25. Thus, PWM control is substantially performed mainly by circuits in the secondary side so that the output voltage is stabilized. This control method is not subject to phase delays as in the case of traditional feedback control using an error amplifier. Therefore, a pulse-by-pulse operation can be enabled for immediately responding to a cycle in which a change in the output voltage occurs due to transient changes in the input voltage and output current.

In addition, the absolute maximum temperature rating of a photocoupler is normally on the order of 100 degrees Celsius, which makes it difficult to use a photocoupler at a high ambient temperature. In addition, a photocoupler has a problem of a change in a relative current transfer ratio (CTR) with passage of time. However, the above signal transmission transformer units 7 and 8 are not subject to such problems and can ensure high reliability.

Note that the present invention is not limited to the embodiments described above and can employ various embodiments. For example, in each of the above embodiments, both the cross-sections of a middle leg and an outer leg have rectangular shapes. However, the middle leg and outer leg may have other shapes such as circular or oval shapes.

In addition, in each of the embodiments, an E-I-shaped core formed by a combination of a four-leg core or a five-leg core and a flat plate core is used. However, it is also possible to use an E-E-shaped core formed by a combination of two four-leg cores or five-leg cores.

In addition, it is possible to provide a magnetic gap at a joint of a middle leg so that a direct current superimposition characteristic is improved.

In addition, while in the third embodiment, a core fixing metal member is used to fit a pair of cores to each other, a core fixing member may be formed of other materials such as plastic. It is also possible to attach the cores to each other using adhesive.

In addition, the number of pairs of outer legs is not limited to one pair. Specifically, as illustrated in FIG. 8 of Patent Document 1, two pairs of outer legs which are orthogonal to each other may be provided. In this case, a maximum of four pulse transformers can be formed. Further, the disclosed features may be applied to an arrangement in which outer legs that are not formed as a pair, as illustrated in FIG. 7 of Patent Document 1, are provided.

In addition, in each of the embodiments of the transformer, a conductor pattern of coils is formed on a printed board. However, the transformer of the present invention is not limited to those using printed boards. Also in a case where a winding is used, a predetermined outer leg may be divided into two outer leg portions with a certain degree of space therebetween allowing coil wiring, and a coil may be wound so that the winding passes through the space.

In addition, in the insulated switching power supply device, a signal transmission transformer unit may be applied not only to driving of a synchronous rectifier and control of output voltage and current, but also to other applications, such as use in various protection circuits for output overvoltage protection, output undervoltage protection, overheating protection, etc.

Further, while the transformer is applied to the insulated switching power supply device, the application of the transformer is not limited to a power transmission transformer or a signal transmission transformer (pulse transformer).

Although particular embodiments have been described, many other variations and modifications and other uses will become apparent to those skilled in the art. Therefore, the present invention is not limited by the specific disclosure herein.

What is claimed is:

1. A composite transformer comprising:
   a core having a middle leg and at least one pair of outer legs on opposite sides with respect to the middle leg, the core forming a closed magnetic path;
   two outer leg portions being defined by at least one of the outer legs being divided with a space therebetween allowing coil wiring therebetween;
   a first pair of coils including at least two coils wound around the middle leg of the core; and
   a second pair of coils including at least two coils respectively wound around said two outer leg portions such that a winding direction of a portion of each of the at least two coils that is wound around one of the two leg portions is opposite to a winding direction of a portion of each of the at least two coils that is wound around another of the two leg portions; wherein
   the first pair of coils and the second pair of coils are arranged such that magnetic interference does not substantially occur between the first pair of coils and the second pair of coils.

2. The composite transformer of claim 1, wherein both of the outer legs are divided into two respective outer leg portions with a space therebetween allowing coil wiring therebetween, and the second pair of coils are wound around both of the outer legs.

3. The composite transformer of claim 2, comprising a printed board having penetration holes through which the middle leg and the outer legs or the outer leg portions of the core are respectively inserted, wherein the coils are configured as conductor patterns formed around the penetration holes of the printed board.

4. The composite transformer of claim 3, wherein the core is constituted by two members sandwiching the printed board, and a core fixing metal member is provided, the core fixing metal member fixing the two members while permitting joint surfaces thereof to rub against each other while the two members overlie each other with the printed board therebetween.

5. The composite transformer of claim 1, comprising a printed board having penetration holes through which the middle leg and the outer legs or the outer leg portions of the core are respectively inserted, wherein the coils are configured as conductor patterns formed around the penetration holes of the printed board.

6. The composite transformer of claim 2, wherein the core is constituted by two members sandwiching the printed board, and a core fixing metal member is provided, the core fixing metal member fixing the two members while permitting joint surfaces thereof to rub against each other while the two members overlie each other with the printed board therebetween.

7. An insulated switching power supply device comprising the composite transformer of any one of claims 1 and 2,
   wherein an input filter for receiving a direct current and at least one power switch are provided in a primary-side circuit, the power switch converting a direct current into an alternating current by a switching operation, and at least one synchronous rectifier and an output filter for converting an alternating current into a direct current are provided in a secondary-side circuit,
   wherein the composite transformer is connected such that a transformer unit comprising the first pair of coils of the composite transformer transmits alternating power from the primary-side circuit to the secondary-side circuit and that a transformer unit comprising the second pair of coils of the composite transformer transmits a first pulse signal from the primary-side circuit to the secondary-side circuit, the first pulse signal indicating a timing immediately before a turn-on of the power switch, and
   wherein a synchronous rectifier turn-off control circuit is provided in the secondary-side circuit, the synchronous rectifier turn-off control circuit detecting the first pulse signal and turning off the synchronous rectifier.

8. An insulated switching power supply device comprising the composite transformer of any one of claims 1 and 2,
   wherein an input filter for receiving a direct current and at least one power switch are provided in a primary-side circuit, the power switch converting a direct current into an alternating current by a switching operation, and at least one synchronous rectifier and an output filter for converting an alternating current into a direct current are provided in a secondary-side circuit,
   wherein an output detecting circuit for detecting an output voltage or an output current is provided in the secondary-side circuit,
   wherein the composite transformer is connected such that a transformer unit comprising the first pair of coils of the composite transformer transmits alternating power from the primary-side circuit to the secondary-side circuit and that a transformer unit comprising the second pair of coils of the composite transformer transmits a second pulse signal from the secondary-side circuit to the primary-side circuit, the second pulse signal indicating an off-timing of the power switch, and
   wherein a power switch turn-off control circuit is provided in the primary-side circuit, the power switch turn-off control circuit detecting the second pulse signal and turning off the power switch.

9. The composite transformer of claim 1, wherein the at least two coils of the second pair of coils are respectively wound around the two outer leg portions with the same number of turns.

* * * * *